(12) United States Patent
Franson

(10) Patent No.: US 12,444,858 B2
(45) Date of Patent: Oct. 14, 2025

(54) ANTENNA APPARATUS EMPLOYING COPLANAR WAVEGUIDE INTERCONNECT BETWEEN RF COMPONENTS

(71) Applicant: VIASAT, INC., Carlsbad, CA (US)

(72) Inventor: Steven J. Franson, Scottsdale, AZ (US)

(73) Assignee: VIASAT, INC., Carlsbad, CA (US)

( * ) Notice: Subject to any disclaimer, the term of this patent is extended or adjusted under 35 U.S.C. 154(b) by 181 days.

(21) Appl. No.: 18/548,631

(22) PCT Filed: Mar. 4, 2021

(86) PCT No.: PCT/US2021/020975
§ 371 (c)(1),
(2) Date: Sep. 1, 2023

(87) PCT Pub. No.: WO2022/186835
PCT Pub. Date: Sep. 9, 2022

(65) Prior Publication Data
US 2024/0154320 A1    May 9, 2024

(51) Int. Cl.
*H01Q 21/00* (2006.01)
*H01Q 1/22* (2006.01)
(Continued)

(52) U.S. Cl.
CPC ....... *H01Q 21/0025* (2013.01); *H01Q 1/2283* (2013.01); *H01Q 1/38* (2013.01); *H01Q 21/0075* (2013.01); *H01Q 21/061* (2013.01)

(58) Field of Classification Search
CPC .... H01Q 21/0025; H01Q 1/2283; H01Q 1/38; H01Q 21/0075; H01Q 21/061; H01Q 23/00; H01P 5/028; H01P 1/047
See application file for complete search history.

(56) References Cited

U.S. PATENT DOCUMENTS 11,038,281 B2 *  6/2021  Franson ............... H01Q 3/38
2019/0089069 A1  3/2019  Niroo et al.
(Continued)

FOREIGN PATENT DOCUMENTS

| JP | 10-233621 A2 | 9/1998 |
| WO | 2008015371 | 2/2008 |
| WO | 2017121477 | 7/2017 |

OTHER PUBLICATIONS

International Search Report and Written Opinion dated Nov. 23, 2021 in corresponding PCT Application No. PCT/US2021/020975 (11 pages).

*Primary Examiner* — Seung H Lee
(74) *Attorney, Agent, or Firm* — F. CHAU & ASSOCIATES, LLC

(57) ABSTRACT

An antenna apparatus includes an antenna substrate having a first surface and an opposite second surface, with an antenna ground plane at the second surface. An antenna element is at the first surface of the antenna substrate. A first RF component is attached to the second surface of the antenna substrate and includes RF circuitry to adjust a signal communicated with the antenna element. A second RF component is attached to the second surface of the antenna substrate. A coplanar waveguide (CPW) interconnect couples the first RF component to the second RF component and includes a central conductor and first and second ground conductors on opposite sides of the central conductor. The central conductor has a profile within an opening in the antenna ground plane.

31 Claims, 13 Drawing Sheets

(51) Int. Cl.
*H01Q 1/38* (2006.01)
*H01Q 21/06* (2006.01)

(56) References Cited

U.S. PATENT DOCUMENTS

| | | | | |
|---|---|---|---|---|
| 2021/0296773 A1* | 9/2021 | Baniya | ................... | H05K 1/181 |
| 2023/0223686 A1* | 7/2023 | Franson | ................... | H01Q 1/38 |
| | | | | 342/372 |
| 2023/0395967 A1* | 12/2023 | Astorga | ................... | H01Q 3/36 |

* cited by examiner

ANTENNA APPARATUS EMPLOYING COPLANAR WAVEGUIDE INTERCONNECT BETWEEN RF COMPONENTS

CROSS REFERENCE TO RELATED APPLICATION(S)

The present Application is a 371 National Stage entry of PCT application no. PCT/US2021/020975, filed Mar. 4, 2021, the entirety of which is incorporated herein by reference.

TECHNICAL FIELD

This disclosure relates generally to interconnection structures between RF components within an antenna apparatus, and to antenna arrays integrated with distributed radio frequency integrated circuit (RFIC) chips.

DISCUSSION OF RELATED ART

Compact antenna arrays have found a variety of diverse applications at microwave and millimeter wave frequencies, such as in aircraft, satellites, vehicles, watercraft, and base stations for general land-based communications. Such antenna arrays typically include microstrip patch radiating elements driven with phase shifting beamforming circuitry to generate a phased array for beam steering. It is often desirable for an entire antenna system, including the antenna array and beamforming circuitry, to occupy minimal space with a low profile.

An integrated antenna array may be understood as an antenna array constructed with antenna elements integrated with radio frequency (RF) integrated circuit chips (RFICs) (e.g., monolithic microwave integrated circuits (MMICs)) in a compact structure. An integrated antenna array may have a sandwich type configuration in which the antenna elements are disposed in an exterior facing component layer and the RFICs are distributed across the effective antenna aperture within a proximate, parallel component layer behind the antenna element layer. The RFICs may include RF power amplifiers (PAs) for transmit, low noise amplifiers (LNAs) for receive, and/or active phase shifters for beam steering. By distributing PAs/LNAs/phase shifters in this fashion, higher efficiency on transmit and/or improved noise performance on receive may be realized, along with higher reliability relative to non-distributed IC designs.

SUMMARY

In an aspect of the present disclosure, an antenna apparatus includes an antenna substrate having a first surface and an opposite second surface, with an antenna ground plane at the second surface. An antenna element is at the first surface of the antenna substrate. A first RF component is attached to the second surface of the antenna substrate and includes RF circuitry to adjust a signal communicated with the antenna element. A second RF component is attached to the second surface of the antenna substrate. A coplanar waveguide (CPW) interconnect couples the first RF component to the second RF component and includes a central conductor and first and second ground conductors on opposite sides of the central conductor. The central conductor has a profile within an opening in the antenna ground plane.

The central conductor and the first and second ground conductors may be formed in a same layer as the antenna ground plane within the antenna substrate.

The first RF component may be an RFIC chip in which the RF circuitry includes beamforming circuitry that includes at least one amplifier and at least one phase shifter.

The antenna substrate may further include a redistribution layer (RDL) region between the antenna ground plane and the second surface, for providing a DC voltage and/or a control signal to the RFIC chip, where the RDL region includes an isolation layer interfacing with the antenna ground plane.

A phased array antenna embodiment may include an antenna substrate having a first surface and an opposite, second surface, the antenna substrate including an antenna ground plane at the second surface. A plurality of antenna elements forming an antenna array are disposed at the first surface of the antenna substrate. A plurality of RFIC chips are attached to the second surface of the antenna substrate, each including beamforming circuitry for beam steering by adjustment of signals communicated with at least one of the antenna elements through at least one of a plurality of first openings in the antenna ground plane. A combiner/divider component is disposed between the RFIC chips and attached to the second surface of the antenna substrate. The combiner/divider component includes a portion of a beamforming network (BFN) including a plurality of combiner/divider conductors. A plurality of coplanar waveguide (CPW) interconnects each couple a respective one of the combiner/divider conductors to one of the RFIC chips and each includes a central conductor and first and second ground conductors on opposite sides of the central conductor. Each central conductor has a profile within a respective one of a plurality of second openings in the antenna ground plane.

BRIEF DESCRIPTION OF THE DRAWINGS

The above and other aspects and features of the disclosed technology will become more apparent from the following detailed description, taken in conjunction with the accompanying drawings in which like reference characters indicate like elements or features. Various elements of the same or similar type may be distinguished by annexing the reference label with an underscore/dash and second label that distinguishes among the same/similar elements (e.g., _1, _2), or directly annexing the reference label with a second label. However, if a given description uses only the first reference label, it is applicable to any one of the same/similar elements having the same first reference label irrespective of the second label. Elements and features may not be drawn to scale in the drawings.

DETAILED DESCRIPTION OF EMBODIMENTS

The following description, with reference to the accompanying drawings, is provided to assist in a comprehensive understanding of certain exemplary embodiments of the technology disclosed herein for illustrative purposes. The description includes various specific details to assist a person of ordinary skill the art with understanding the technology, but these details are to be regarded as merely illustrative. For the purposes of simplicity and clarity, descriptions of well-known functions and constructions may be omitted when their inclusion may obscure appreciation of the technology by a person of ordinary skill in the art.

Figures 1A, 1B:
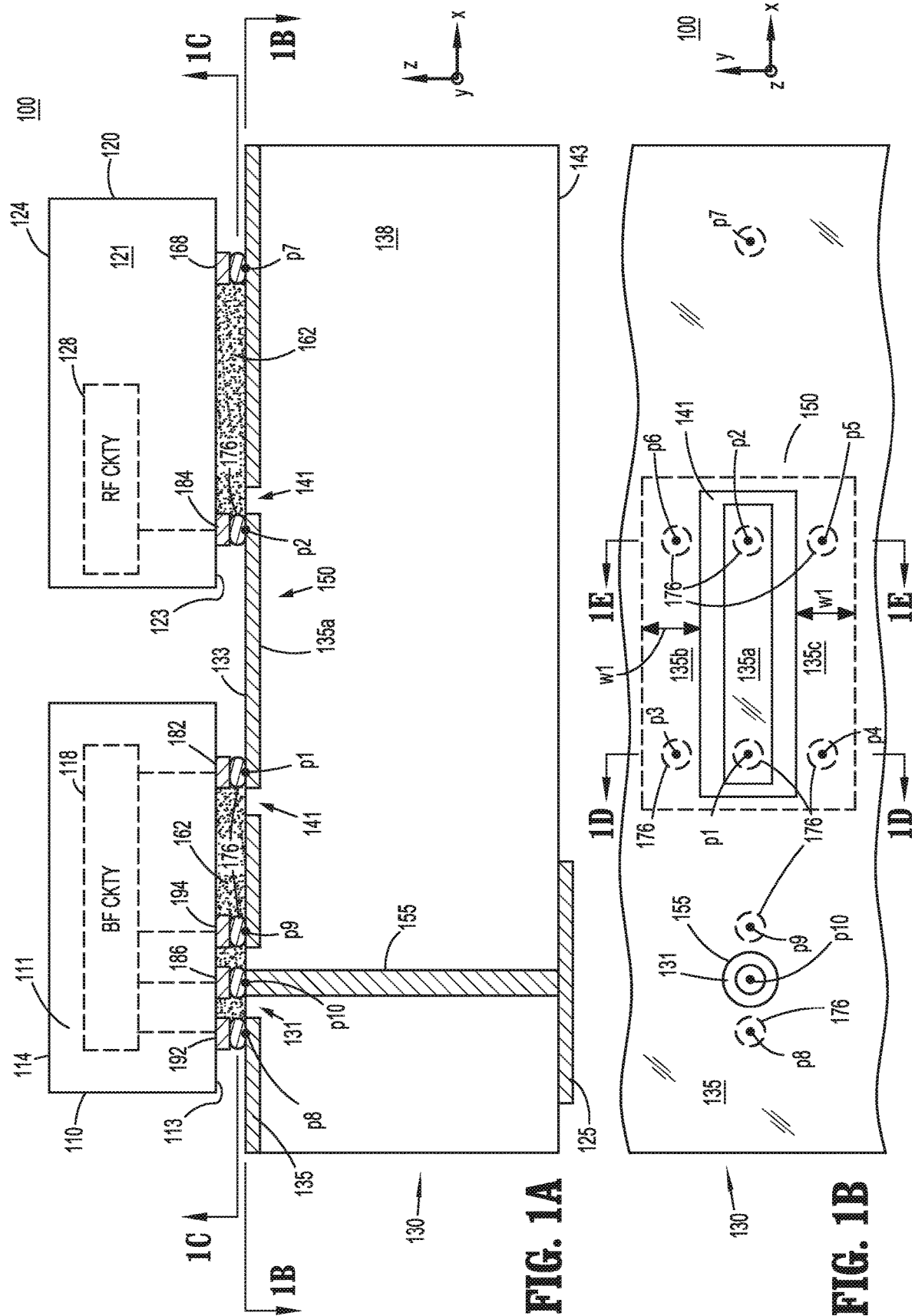
FIG. 1A is a cross-sectional view of an antenna apparatus according to an embodiment, which depicts an example CPW interconnect between an RFIC chip and an RF component of the antenna apparatus.
FIG. 1B is a plan view of an upper portion of an antenna substrate of the antenna apparatus, taken along the lines 1B-1B of FIG. 1A, illustrating the example CPW interconnect.

FIG. 1A is a cross-sectional view of an antenna apparatus 100 according to an embodiment. Antenna apparatus 100 ("antenna 100") includes at least one first RF component ("RFC") 110, at least one second RFC 120, an antenna substrate 130, and at least one antenna element 125. Antenna substrate 130 may have a lower (first) surface 143 to which antenna element 125 is attached, and an upper surface 133 to which first RFC 110 and second RFC 120 are both attached. Antenna substrate 130 may be composed of a dielectric slab 138 integrated with an antenna ground plane 135 located at the upper surface 133 of antenna substrate 130.

First and second RFCs 110 and 120 include RF circuitry 118 and 128, respectively, to adjust RF signals passing therethrough. Depending on the type of RFC, such adjustment may be passive or active. A passive RFC may be a transmission line component with a fixed insertion loss and phase characteristic, such as a combiner/divider or a connector. An active RFC may be an RF integrated circuit (RFIC) chip that includes one or more amplifiers and/or one or more phase shifters to provide a controllable insertion loss or gain/controllable insertion phase. Herein, active RF circuitry may be referred to as beamforming circuitry. In the example of FIG. 1A and other examples hereafter, first RFC 110 is exemplified as an RFIC chip, and RF circuitry 118 is exemplified as beamforming circuitry that adjusts a signal communicated with antenna element 125 through a first opening 131 in ground plane 135. (Hereafter, in discussing this example, first RFC 110 may be referred to as RFIC chip 110 or just "RFIC 110", and RF circuitry 118 may be referred to as beamforming circuitry 118.) A via 155 extending through dielectric 138 and first opening 131 may serve as a probe feed that couples antenna element 125 to beamforming circuitry 118. In other embodiments in which first RFC 110 is a passive RFC, RF circuitry 118 therein may be coupled to antenna element 125 directly, in the same manner as in FIG. 1A, or indirectly through an intervening RF component (not shown).

Second RF component 120 may include passive and/or active RF circuitry 128 within or printed on a dielectric and/or semiconductor substrate 121. One example of second RFC 120 is a combiner/divider network. If antenna 100 is embodied as an active array with multiple antenna elements 125 and multiple RFIC chips 110 distributed across the effective aperture of antenna 100, such a combiner/divider network of second RFC 120 may have a plurality of combiner/divider conductors (sometimes called "branch arms" herein), each coupled to one of the RFIC chips 110. This example will be discussed later in connection with FIG. 6. Other examples of second RFC 120 include an RF amplifier chip, and a digital chip.

FIG. 1B is a cross-sectional view taken along the lines 1B-1B of FIG. 1A, which corresponds to a plan view of the upper portion of antenna substrate 130. Referring to FIGS. 1A-1B, a coplanar waveguide (CPW) interconnect 150 couples first RFC 110 to second RFC 120, completing an electrical connection between RF circuitry 118 and RF circuitry 128. CPW interconnect 150 is formed by a central conductor 135a, and first and second ground conductors 135b, 135c on opposite sides of central conductor 135a. Each of central conductor 135a and ground conductors 135b, 135c are respective portions of ground plane 135. Central conductor 135a may be a rectangular strip disposed within a second opening 141 of ground plane 135. Upper and lower peripheral portions of second opening 141 separate central conductor 135a from first and second ground conductors 135b and 135c, respectively. Left and right peripheral portions of second opening 141 separate central conductor 135a from adjacent left and right regions of ground plane 135. (Note that in the view of FIG. 1A, distal portions of ground plane 135 in the regions of openings 131 and 141 are omitted for clarity.) Thus, central conductor 135a is in the form of an island with respect to surrounding portions of ground plane 135, and is electrically isolated therefrom by isolation material or an air gap within second opening 141. It is noted here that because central conductor 135a has peripheral edges within second opening 141, central conductor 135a may be described as having a profile within second opening 141. As used herein, a profile of the central conductor within an opening in the ground plane refers to the central conductor's perimeter being partially or completely surrounded by the opening when the central conductor and the opening are projected onto a different plane that is parallel to the ground plane. In FIG. 1A, central conductor 135a is formed in the same layer as ground plane 135. Therefore, profile of central conductor 135a is within second opening 141 in the ground plane, as well as when both are projected onto a different plane that is parallel to the ground plane 135. In other embodiments described below, the central conductor of a CPW interconnect is slightly offset in the z direction (the direction perpendicular to the ground plane) from the opening. In those embodiments, a profile of the central conductor is within the opening in the ground plane because the central conductor's perimeter is partially or completely surrounded by the opening when the opening and the central conductor are projected onto a different plane that is parallel to the ground plane. For example, in FIG. 3 described later, a central conductor 308a of a CPW transition is slightly offset vertically from a second opening 441 in the ground plane and the central conductor 308a is understood to have a profile within second opening 441.

First and second ground conductors 135b and 135c may be defined as portions of ground conductor 135 of sufficient width W1 for containing electromagnetic (EM) fields propagating between RFIC chip 110 and second RFC 120. For example, portions of ground plane 135 above and below ground conductors 135b and 135c (beyond the width W1 in the y direction) might be used for other CPW interconnects between first and second RFCs 110 and 120.

By providing CPW interconnect 150 as a portion of antenna ground plane 135, i.e., as part of the same metal layer as ground plane 135 in the thickness direction (z direction), antenna substrate 130 may be formed with a single layer of dielectric 138. Thus, antenna substrate 130 may be denoted as a "single RF layer" substrate, where the "single RF layer" may be understood as the layer between antenna element 125 and ground plane 135. (In other embodiments discussed below, a thin control signal/DC signal layer is provided above ground plane 135; the antenna substrate in these embodiments may also be characterized as a single RF layer substrate.) By configuring antenna substrate 130 as a single RF layer substrate, there is no need to provide an RF redistribution layer with an additional metal layer (transmission line layer) at a distance below the upper surface 133 (in the z direction) of antenna substrate 130, above a buried antenna ground plane. Such an additional RF distribution layer would typically include an isolation layer between the buried ground plane and the transmission line layer, and another isolation layer above the transmission line layer. Thus, the antenna substrate would otherwise be formed as a complex dual RF layer substrate, an outcome that is avoided with the present embodiments. On the other hand, the single RF layer substrate of the present embodiments facilitates the manufacturing of the antenna apparatus, and allows for a thinner antenna substrate 130 by avoiding the need for the additional isolation layer(s) of the dual RF layer substrate.

Ground plane 135 may have been formed on dielectric 138 by depositing a layer of conductive material using any suitable technique. First and second openings 131 and 141 may have been formed in ground plane 135, e.g., by not depositing conductive material in regions of the openings during the ground plane layer formation. Openings 131 and 141 may be filled with isolation material, e.g., the same material as dielectric 138. Alternatively, no isolation material is used, such that openings 131, 141 each form a recessed annular cavity from upper surface 133.

Figure 1C:
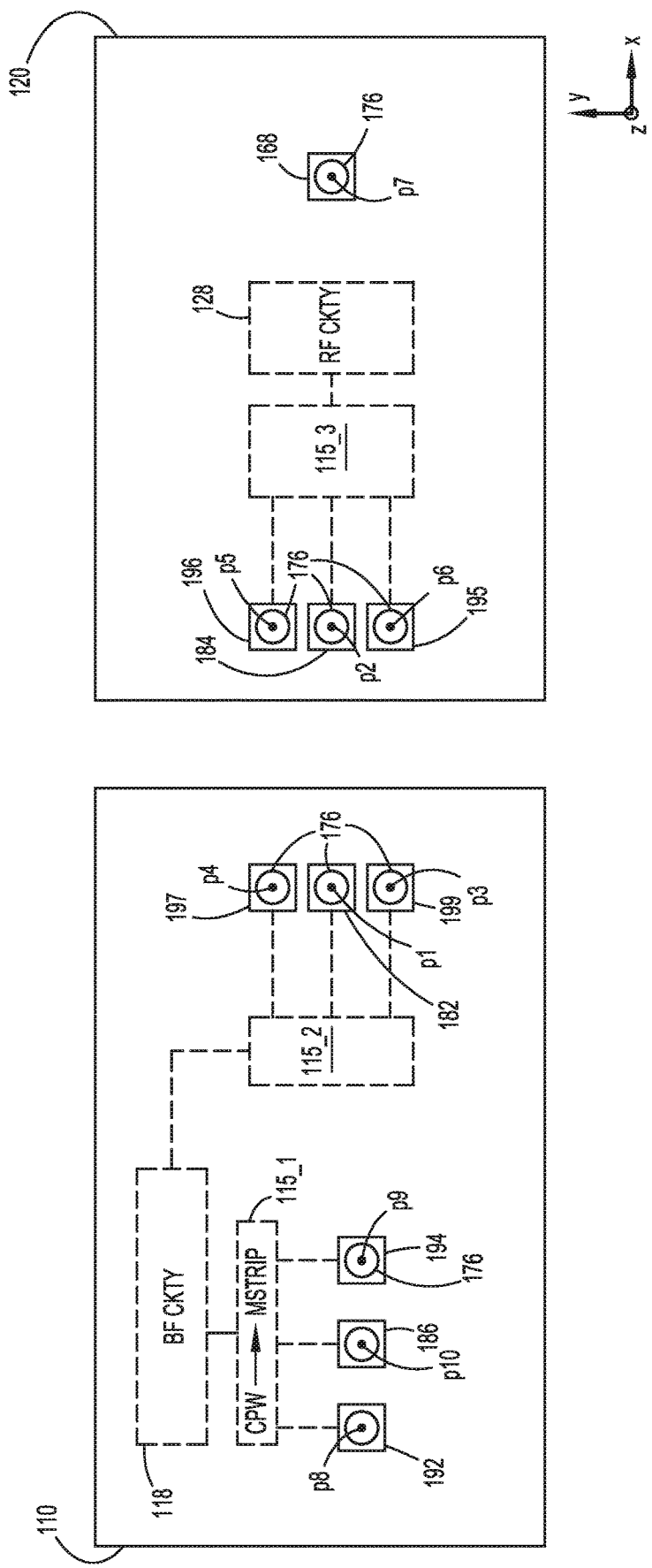
FIG. 1C is a plan view of a portion of the antenna apparatus taken along the lines 1C-1C of FIG. 1A, illustrating example electrical contacts of the RFIC chip and the RF component in relation to the CPW interconnect.
Figure 1D:
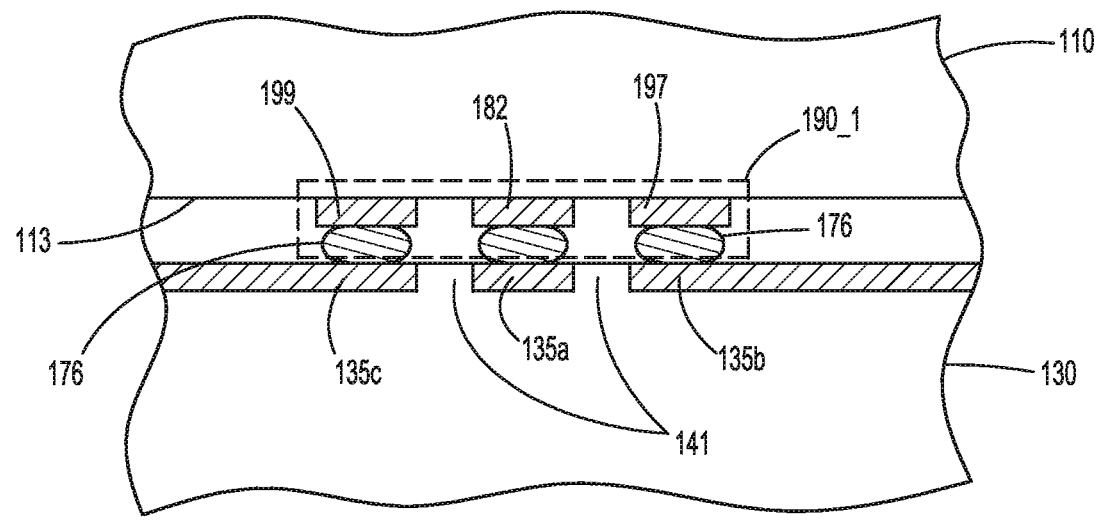
FIG. 1D is a cross-sectional view taken along the lines 1D-1D of FIG. 1B, illustrating a first ground-signal-ground (GSG) transition connecting the CPW interconnect to the RFIC chip.
Figure 1E:
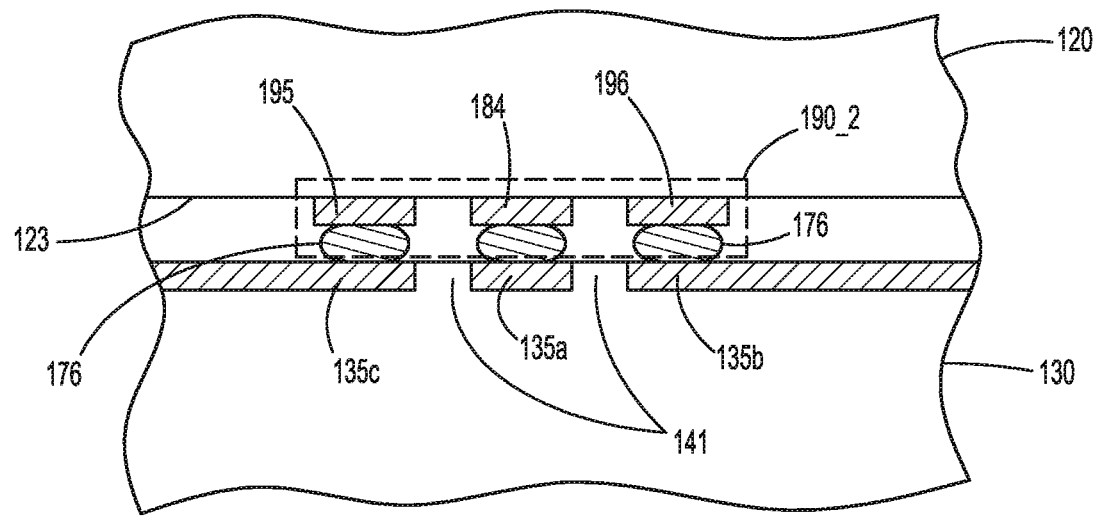
FIG. 1E is a cross-sectional view taken along the lines 1E-1E of FIG. 1B, illustrating a second (GSG) transition connecting the CPW interconnect to the RF component.

FIG. 1C is a plan view of a portion of antenna 100 taken along the lines 1C-1C of FIG. 1A, and illustrates example electrical contacts of RFIC chip 110 and second RFC 120 in relation to CPW interconnect 150. FIGS. 1D and 1E are cross-sectional views taken along the lines 1D-1D and 1E-1E of FIG. 1B, respectively. Referring collectively to FIGS. 1A-1E, a first ground-signal-ground (GSG) transition 190_1 may connect a first end of CPW interconnect 150 to RFIC chip 110 at points p1, p2 and p4. A second GSG transition 190_2 may connect a second, opposite end of CPW interconnect 150 to second RFC 120 at points p2, p6 and p5. First GSG transition 190_1 may include an RF contact pad ("signal contact") 182 of RFIC chip 110; first and second ground contact pads ("ground contacts") 197 and 199 of RFIC chip 110 on opposite sides of signal contact 182; and electrical connection joints 176 connecting the contacts 182, 197 and 199 to points p1, p4 and p3 of conductors 135a, 135c and 135b, respectively. Second GSG transition 190_2 may include a signal contact 184 of second RFC 120; third and fourth ground contacts 196 and 195 of second RFC 120 on opposite sides of signal contact 184; and electrically conductive joints 176 connecting the contacts 184, 196 and 195 to points p5, p2 and p6 of conductors 135a, 135c and 135b, respectively. Examples of electrically conductive joints 176 include a solder ball, a gold bump, a copper pillar with a solder cap, a thermocompression bond and a conductive epoxy. A surface finish metal layer (not shown) such as Electroless Nickel Electroless Palladium Immersion Gold (ENEPIG) may be present between any of the contact pads conductively adhered to a connection joint 176, to help liquefiable metal (e.g. solder) of connection joint 176 to adhere to the contact pad. An underfill material 162 may surround at least some of the connection joints 176 to provide mechanical support to the connection joints and thereby improve their reliability. Typically, underfill material 162 may be a mixed material composed primarily of amorphous fused silica.

Another GSG transition may be provided at connection points p8, p9 and p10 to connect via 155 and ground points of ground plane 135 on opposite sides of via 155 to respective contacts of RFIC chip 110, so as to enable RF signal energy to flow freely from beam forming circuitry 118 to antenna element 125. To this end, one end of via 155 electrically connects to antenna element 125 while an opposite end connects at point p10 to a signal contact 186 of RFIC chip 110 through an electrically conductive joint 176. Ground points p8 and p9 of ground plane 135 on opposite sides of via 155 across first opening 131 may connect through respective joints 176 to ground contacts 192 and 194, respectively. Contacts 186, 192 and 194 (hereafter, the "antenna element contacts") are coupled to an input portion of beamforming circuitry 118, such as to input circuit nodes of a receive amplifier or output circuit nodes of a transmit amplifier. Contacts 182, 197 and 199 ("CPW interconnect contacts") are coupled to an output portion of beamforming circuitry 118, such as to a phase shifter or a filter. The structure and type of transitions between beamforming circuitry 118 and each of the antenna element contacts and the CPW interconnect contacts depends on whether beamforming circuitry 118 is formed in a microstrip transmission line or a CPW transmission line, and whether RFIC chip 110 is connected in a "flip-chip" arrangement with respect to antenna substrate 130. When beamforming circuitry 118 is formed in a microstrip transmission line, RFIC chip 110 may be denoted a "microstrip chip", and when formed in a CPW transmission line, RFIC chip 110 may be denoted a "CPW chip".

When RFIC chip 110 is embodied as a microstrip chip, a CPW to microstrip transition 115_1 may be coupled between the antenna element contacts and the input portion of beamforming circuitry 118. Likewise, a CPW to microstrip transition 115_2 may be coupled between the output portion of beamforming circuitry 118 and the CPW interconnect contacts. If RFIC chip 110 is also connected to antenna substrate 130 in a flip-chip arrangement, an active die side of RFIC chip 110 is proximate the lower surface 113 and faces antenna substrate 130. For instance, doping regions and metallization of beamforming circuitry transistors, as well as combiner/divider conductors (if any) are located within the active regions.

In the case of a microstrip chip, a microstrip ground plane of RFIC chip 110 may be located at the upper surface 114, and a "ground via" (not shown) may extend from each of ground contacts 192, 194, 197 and 199 through material 112 to the microstrip ground plane. The signal conductor of the microstrip transmission line may be located in the active region, such that short or direct connections may be made between the signal conductor and each of signal contacts 186 and 182. Conversely, if RFIC chip 110 is connected to antenna substrate 130 in a non-flip-chip arrangement, the active die side and the microstrip signal conductor may be at the upper surface 114, and the microstrip ground plane may be located at the lower surface 113. In this case, short or direct connections may be made between the microstrip ground plane and each of ground contacts 192, 194, 197 and 199, and a "signal via" may extend from each of signal contacts 186 and 182 to the microstrip signal conductor.

When RFIC chip 110 is embodied as a CPW chip (transitions 115_1 and 115_2 are omitted) and arranged as a flip-chip, the active die side and a CPW transmission line of beamforming circuitry 118 may be at lower surface 113, such that short or direct connections may be made between respective points of the central conductor of the CPW transmission line and each of signal contacts 182 and 186, and between each of the ground conductors of the CPW transmission line and the ground contacts 192, 194, 197, 199. When the CPW chip is connected in a non-flip-chip arrangement, the active die side and the CPW transmission lines are at the upper surface 114. In this scenario, ground vias extending through material 111 may connect each of the ground contacts to respective ground points of the CPW transmission line, and signal vias may connect the signal contacts 182 and 186 to respective points of central conductors of the CPW transmission line.

Similarly, the types of transitions between contacts 184, 195 and 196 of second RFC 120 and RF circuitry 128 depends on the type of transmission line transmission line of RF component 120, and whether the signal conductor(s) of second RFC 120 is arranged at the lower surface 123 or the upper surface 124 of second RFC 120. For instance, a CPW to microstrip transition 115_3 may be coupled between the contacts and RF circuitry 128 when the latter is formed with a microstrip transmission line. Note that second RFC 120 may further include one or more further contacts 168 that may be adhered by a joint 176 to upper surface 133 of antenna substrate 130 at point p7. Contact 168 may provide further mechanical support for the connection of second RFC 120 and/or may be another RF contact electrically coupled to another RFIC chip 110.

In antenna 100 and other embodiments described hereinbelow, antenna elements 125 may each be a microstrip patch antenna element printed on antenna substrate 130. Other types of antenna elements such as dipoles or monopoles may be substituted. When embodied as microstrip patches, antenna elements 125 may have any suitable shape such as circular, square, rectangular or elliptical, and may be fed and configured in a manner sufficient to achieve a desired polarization, e.g., circular, linear, or elliptical. The number of antenna elements 125, their type, sizes, shapes, inter-element spacing, and their feed mechanism may vary from embodiment to embodiment according to performance objectives of the application. For instance, while an example of antenna 600 below (FIG. 6) is illustrated with eight antenna elements 125, a typical embodiment for achieving a narrow antenna beam may include hundreds or thousands of antenna elements 125. In another example, each antenna element 125 is fed by two offset vias 155 using a different circular polarization feeding method. In other examples, an electromagnetic feed mechanism is used instead of a via 155, where each antenna element 125 is excited from a respective feed point with near field energy.

In antenna 100 and other embodiments described hereinbelow, the antenna may be configured for operation over a millimeter (mm) wave frequency band, generally defined as a band within the 30 GHz to 300 GHz range. In other cases, antenna 100 operates in a microwave range from about 1 GHz to 30 GHz, or in a sub-microwave range below 1 GHz. Herein, an RF signal denotes a signal with a frequency anywhere from below 1 GHz up to 300 GHz. Note that an RFIC 110 configured to operate at microwave or millimeter wave frequencies is often referred to as a monolithic microwave integrated circuit (MMIC), and is typically composed of III-V semiconductor materials such as indium phosphate (InP) or gallium arsenide (GaAs), or other materials such as silicon-germanium (SiGe).

Figure 2A:
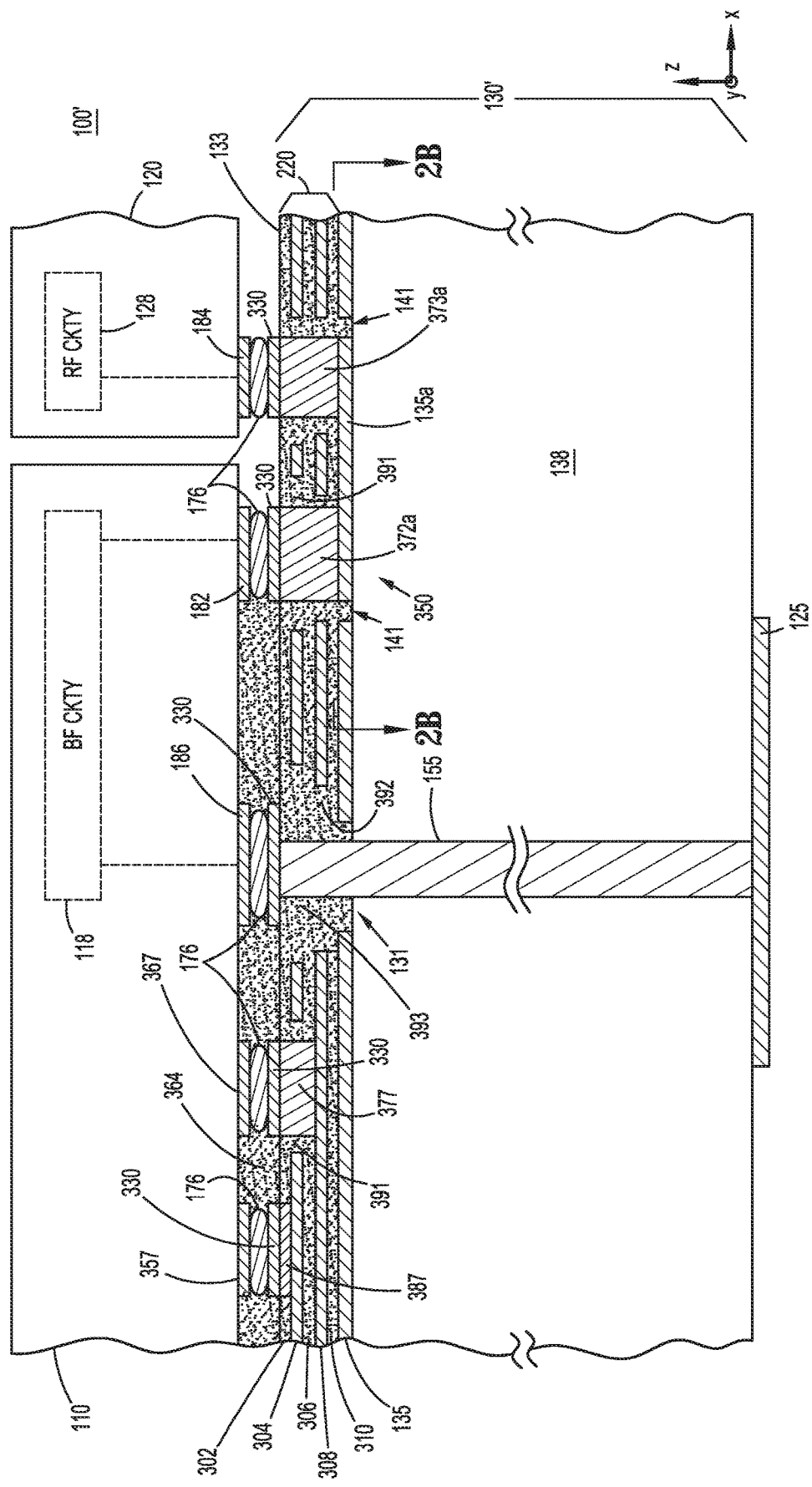
FIG. 2A is a cross-sectional view of an antenna apparatus according to an embodiment, which depicts another example CPW interconnect within an antenna substrate that has a redistribution layer (RDL).

FIG. 2A is a cross-sectional view of an antenna apparatus 100' according to another embodiment. Antenna apparatus ("antenna") 100' differs from antenna 100 described above by configuring an antenna substrate 130' with a thin redistribution layer (RDL) region 220 above ground plane 135. A CPW interconnect 350 to couple RFIC chip 110 to second RFC 120, similar to the above-described CPW interconnect 150, may be formed by portions of ground plane 135 and an opening 141 in ground plane 135. FIG. 2A illustrates a single RFIC chip 110 and a single second RFC 120; however, antenna 110' may include multiple RFICs 110, each with one or more CPW interconnects 350 for coupling to one or more second RFCs 120.

RDL region 220 may include, in order from upper surface 133 of antenna substrate 130' to ground plane 135, a first isolation layer 302, a first conductive layer 304, a second isolation layer 306, a second conductive layer 308, and a third isolation layer 310. In other embodiments, RDL region 220 has just a single conductive layer, or three or more conductive layers, with a suitable number of isolation layers in each case. First and second conductive layers 304, 308 may be patterned to form signal lines used to route DC and/or control signals to RFIC chip(s) 110 (and to second RFC 120 if active circuitry is included therein). Conductive layers 304 and 308 are composed of metal or other conductive material. Openings such as 391, 392, 393 may have been formed in conductive layers 304 and 308, e.g., by not depositing conductive material in regions of the openings during the respective layer formation. Likewise, first opening 131 and second opening 141 may have been formed in the ground plane 135 layer in the same manner. The various openings may be filled by isolation material. Via 155 traverses openings 131, 392 and 393 and is isolated from conductive layers 304, 308 and 135 by the isolation material.

Each of the layers 302, 304, etc. within layer region 220 may be at least one order of magnitude thinner than dielectric 138. For example, each of these layers may have a thickness (in the z direction) on the order of 2-10 μm, whereas dielectric 138 may be on the order of 250 μm thick. First and second conductive layers 304 and 308 may each form signal/ground lines in the x-y plane having a width on the order of 12 μm and spaced from one another by a spacing on the order of 12 μm. Each of layers 304 and 308 may have been etched or otherwise patterned to form tens, hundreds or thousands of signal lines and ground lines in a typical embodiment of antenna 100'. However, in other embodiments (such as that of FIGS. 1A-1E), layer RDL region 220 is omitted, in which case bias voltages and signals are routed to RFICs 110 by other means.

In an active array embodiment, RFIC chip 110 may have tens or over one hundred electrical contacts such as 357, 367 at its lower surface. These contacts may receive bias voltages and/or control signals from signal lines formed in first and second conductive layers 304 and 308, through interconnects with conductive joints 176. For instance, to form an interconnect for connecting a signal line formed in first conductive layer 304 to electrical contact 357, an opening may have been made in first isolation layer 302 to expose the signal line of the first conductive layer 304, and a conductive well 387 may have been formed in the opening. The opening in first isolation layer 302 may have been made by placing resist material on layer 304 in the location of the subsequent opening and then depositing the isolation material of isolation layer 302 in regions that exclude the resist material. A contact pad 330 may have been formed on the well 387, and a conductive joint 176 formed by a heating/cooling process may connect contact pad 330 with contact 357. Alternatively, contact pad 330 is omitted and conductive joint 176 conductively adheres directly to well 387.

In a similar fashion, to form an interconnect for connecting a signal line formed in second conductive layer 308 to electrical contact 367, an opening may have been formed in each of first isolation layer 302, first conductive layer 304 and second isolation layer 306. The process of forming the openings may have likewise involved placing resist material in the locations of the subsequent openings, one layer at a time, while the corresponding layer material is deposited. Additional isolation material (e.g., the same material as that of isolation layers 302, 306) may have been deposited in an annular region around the opening 391 in first conductive layer 304. This material prevents shorting to a subsequent conductive well 377 formed by deposition or the like within a cavity produced by the series of openings. A contact pad 330 may have been formed on conductive well 377. A conductive joint 176 connects electrical contact 367 to contact pad 330, or connects electrical contact 367 directly to conductive well 377 if contact pad 330 is omitted.

Figure 2B:
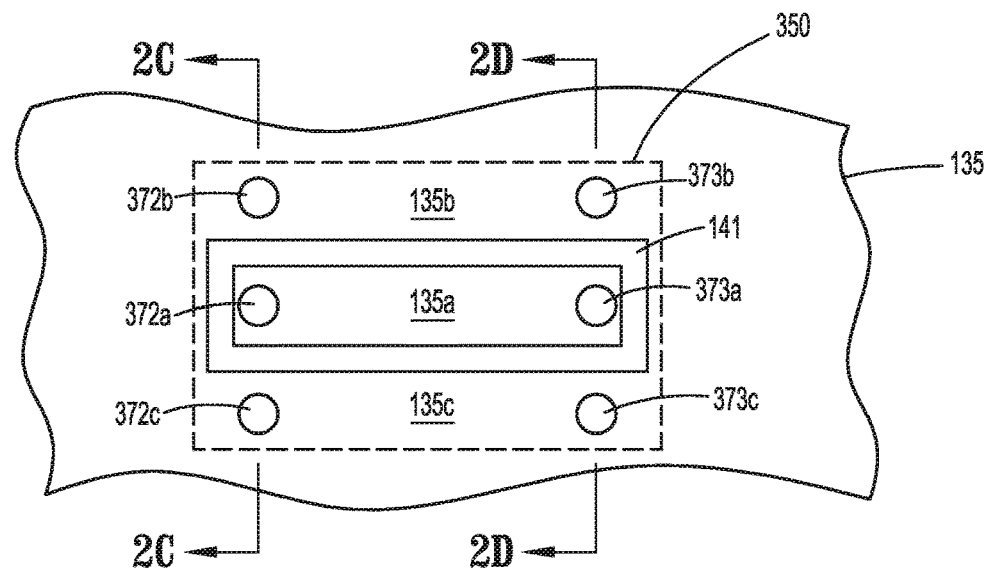
FIG. 2B is a cross-sectional view of a portion of the antenna apparatus taken along the lines 2B-2B of FIG. 2A, illustrating the example CPW interconnect.
Figure 2C:
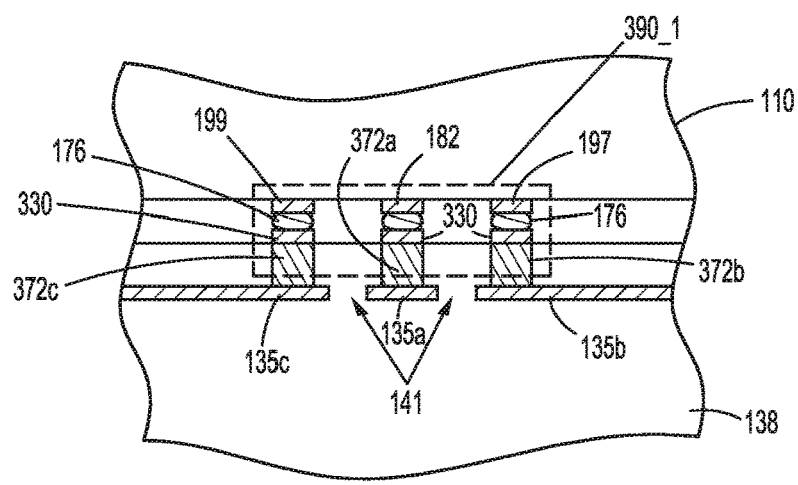
FIG. 2C is a cross-sectional view of a portion of the antenna apparatus taken along the lines 2C-2C of FIG. 2B, illustrating a first GSG transition portion of the example CPW interconnect.
Figure 2D:
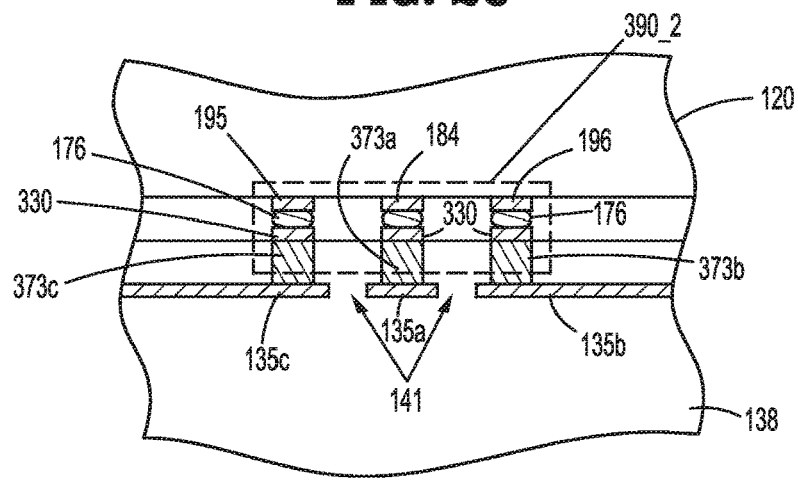
FIG. 2D is a cross-sectional view of a portion of the antenna apparatus taken along the lines 2D-2D of FIG. 2B, illustrating a second GSG transition portion of the example CPW interconnect.

FIG. 2B is a cross-sectional view of a portion of antenna 100' taken along the lines 2B-2B of FIG. 2A. FIGS. 2C and 2D are cross-sectional views taken along the lines 2C-2C and 2D-2D, respectively, of FIG. 2B. Referring collectively to FIGS. 2A-2D, CPW interconnect 350 may have the same or similar layout in ground plane 135 as CPW interconnect 150 described above. Thus, CPW interconnect 350 may have a central conductor 135a in the form of an island surrounded by opening 141, and first and second ground conductors 135b, 135c extending lengthwise on opposite sides of central conductor 135a. A first GSG transition 390_1 may connect a first end of CPW interconnect 350 to RFIC 110, and a second GSG transition 390_2 may connect the opposite end of CPW interconnect 350 to RF component 120. First GSG transition 390_1 may include conductive wells 372a, 372b and 372c, which connect to contact pads 182, 197 and 199, respectively, of RFIC chip 110, each through a respective conductive joint 176 and contact pad 330. Second GSG transition 390_2 may include conductive wells 373a, 373b and 373c, which connect to contact pads 184, 196 and 195, respectively, of RF component 120, each through a respective conductive joint 176 and contact pad 330. Conductive wells 372a-372c and 373a-373c may have each been formed in a similar manner as conductive well 377, with a process that forms additional openings through second conductive layer 308 and third isolation layer 310 to expose a surface of ground plane 135. Additional isolation material may have been deposited in annular regions surrounding the respective openings in second conductive layer 308 to prevent shorting to conductive wells 372a-372c and 373a-373c which are subsequently formed. Other aspects of antenna 100' may be the same as those described above for antenna 100. It is noted here that for the same reasons explained above for antenna 100, central conductor 135a of FIGS. 2A and 2B has a profile within second opening 141.

Figure 3:
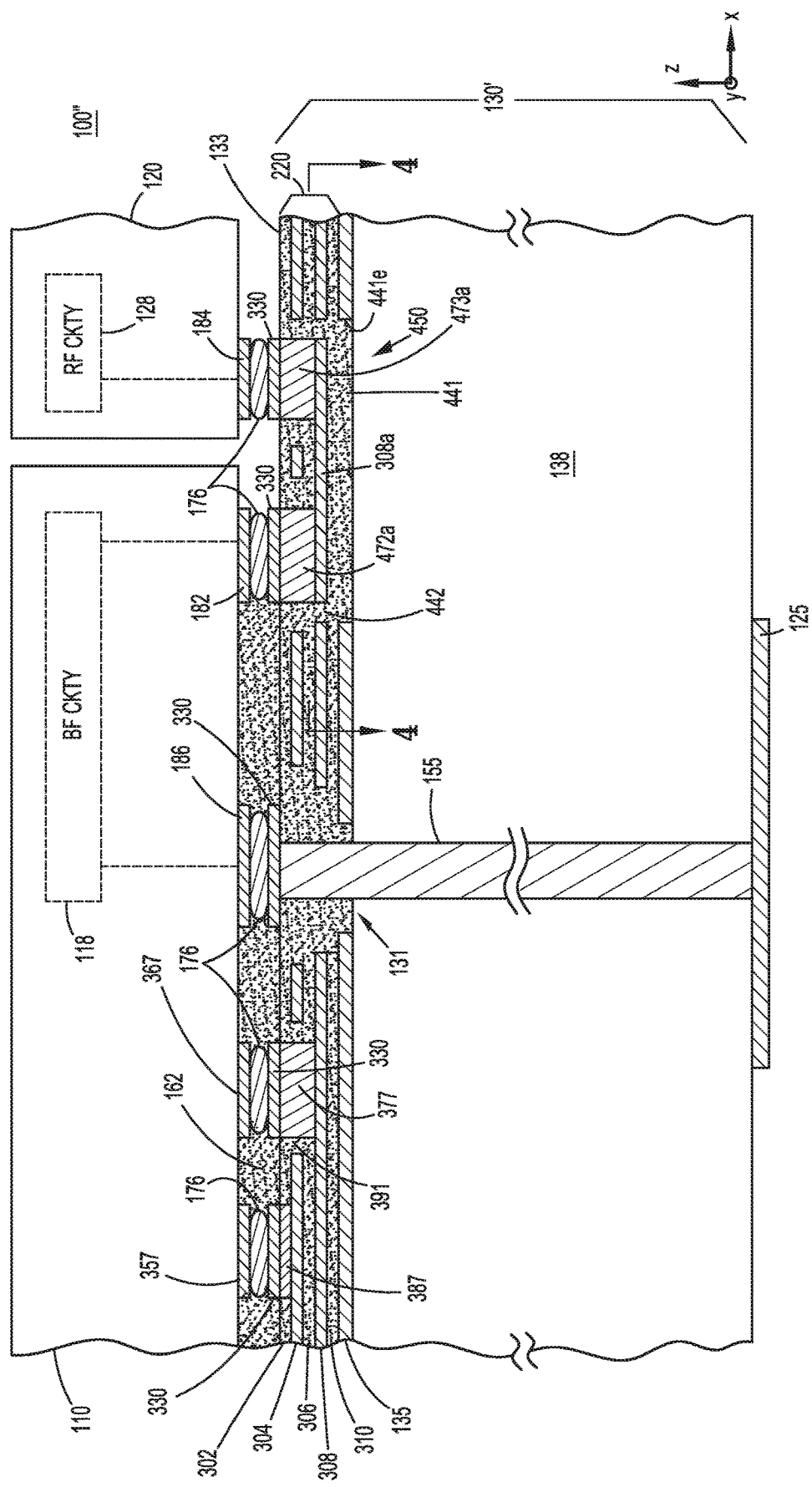
FIG. 3 is a cross-sectional view of an antenna apparatus according to an embodiment, which depicts a further example of a CPW interconnect, at least partially formed within an RDL region of an antenna substrate.

FIG. 3 is a cross-sectional view of an antenna apparatus, 100", according to another embodiment. Antenna 100" differs from antenna 100' of FIGS. 2A-2D by providing a CPW interconnect 450 formed at least partially within RDL region 220. To this end, CPW interconnect 450 may include a central conductor 308a, which is a portion of conductive layer 308, in the form of an island isolated from other surrounding regions of conductive layer 308 by a picture frame-like opening 442 in conductive layer 308. Further, a rectangular opening 441 is formed within ground plane 135 in a region directly beneath central conductor 308a. Opening 441 prevents ground plane 135 from disturbing the fields of signals propagating through CPW interconnect 450. Because central conductor 308a has peripheral edges in the x-y plane that fall within the x-y space of second opening 441, central conductor 308a may be described as having a profile within second opening 441. That is, a projected profile of central conductor 308a, as defined above, falls within second opening 441. Explained another way, central conductor 308a, when viewed (as in FIG. 4A) from a distant point in the z direction along an axis running through the center of central conductor 308a, appears as an island within second opening 441.

Figure 4A:
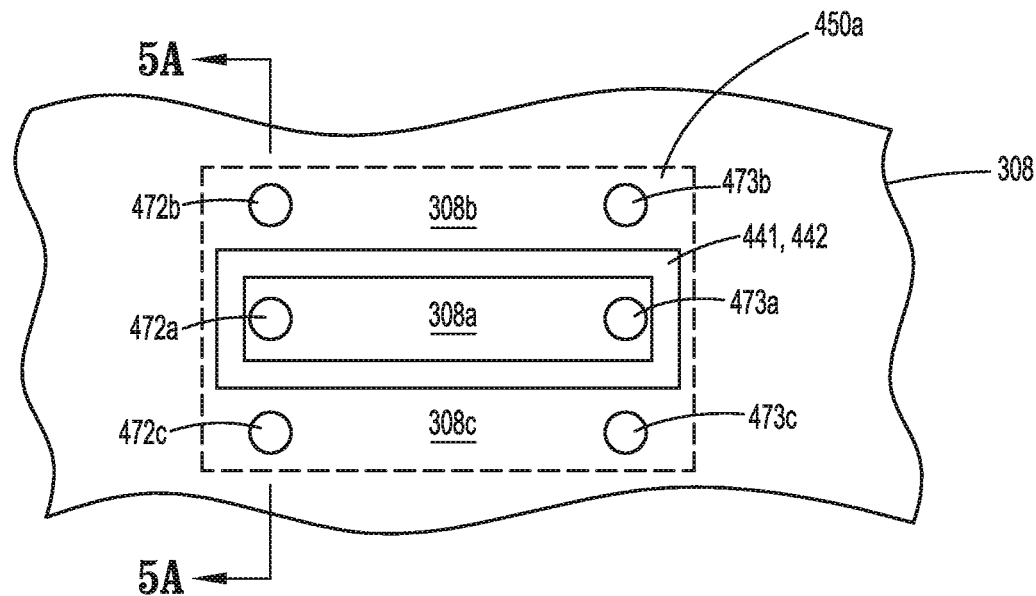
FIG. 4A is a cross-sectional view of an example configuration of a portion of the antenna apparatus taken along the lines 4-4 of FIG. 3.
Figure 5A:
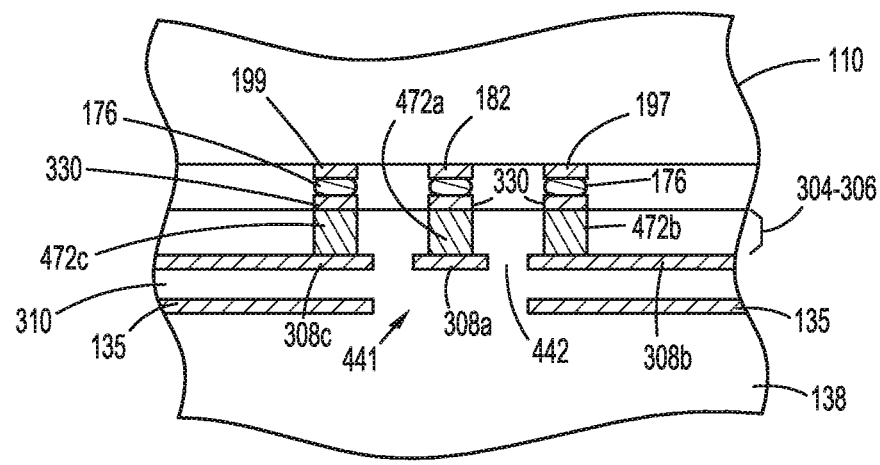
FIG. 5A is a cross-sectional view taken along the lines 5A-5A of FIG. 4A.

FIG. 4A is a cross-sectional view of an example configuration of a portion of antenna 100" taken along the lines 4-4 of FIG. 3. FIG. 5A is a cross-sectional view taken along the lines 4-4 of FIG. 4A, with some distal elements removed for clarity. In this embodiment, a CPW interconnect 450a is an example of CPW interconnect 450 of FIG. 3. Here, CPW interconnect 450a may include central conductor 308a and first and second ground conductors 308b and 308c, all of which are portions of conductive layer 308. Conductive well 472a may couple central conductor 308a to RF contact 182 through a contact pad 330 and a conductive joint 176. Conductive well 472a may have been formed with the same type of process as conductive well 377 described above. The same type of conductive wells 472b and 472c may couple ground conductors 308b and 308c to ground contacts 197 and 199, respectively. Hence, conductive wells 472a-472c form a GSG transition between a first end of CPW interconnect 450a to RFIC chip 110. A similar or identical GSG transition may be provided by conductive wells 473a, 473b and 473c to couple the opposite end of CPW interconnect 450a to contacts 184, 195 and 196 of RF component 120.

Figure 4B:
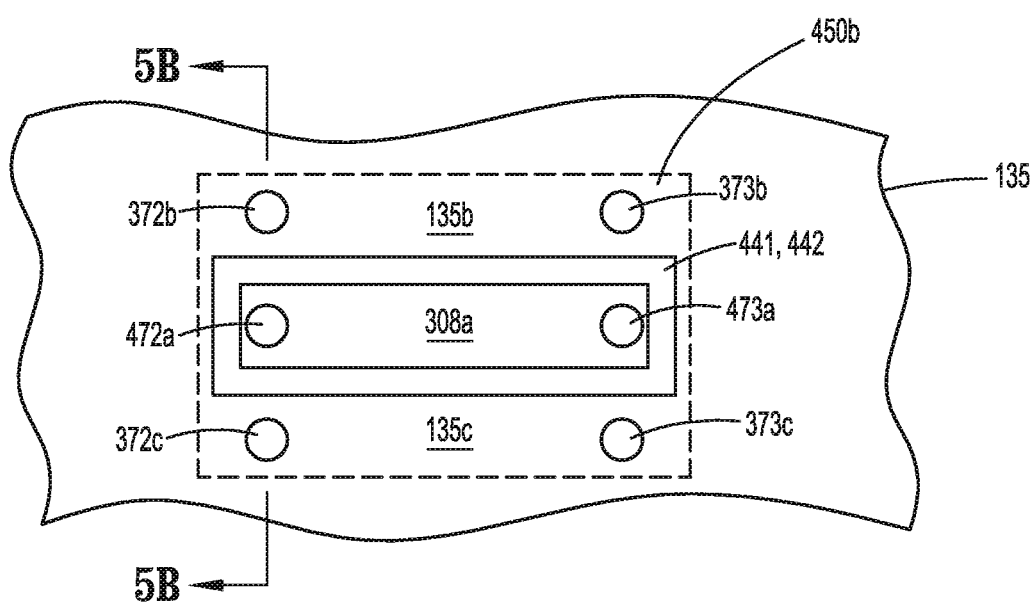
FIG. 4B is a cross-sectional view of another example configuration of a portion of the antenna apparatus taken along the lines 4-4 of FIG. 3.
Figure 5B:
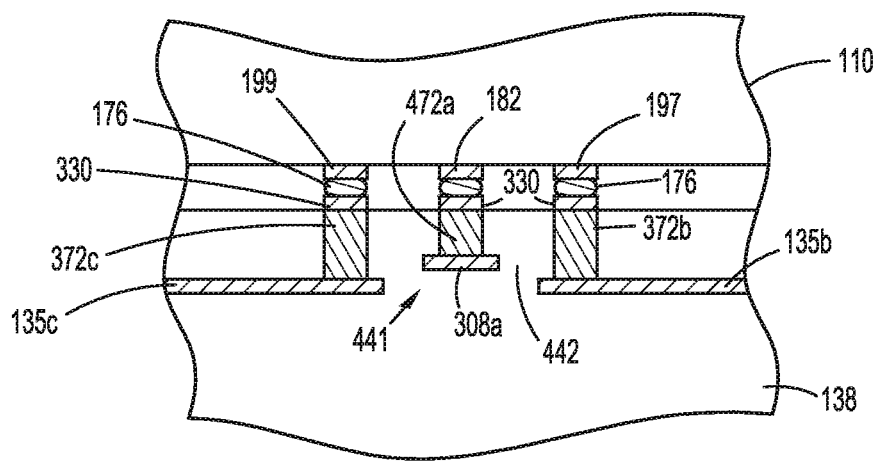
FIG. 5B is a cross-sectional view taken along the lines 5B-5B of FIG. 4B.

FIG. 4B is a cross-sectional view of another example configuration of a portion of antenna 100" taken along the lines 4-4 of FIG. 3, with some intervening features removed for clarity. FIG. 5B is a cross-sectional view taken along the lines 4-4 of FIG. 4B, with some distal elements removed for clarity. In this embodiment, a CPW interconnect 450$b$ is an example of CPW interconnect 450 of FIG. 3. Here, CPW interconnect 450$b$ may include central conductor 308$a$ and first and second ground conductors 135$b$ and 135$c$. Thus, the central conductor of CPW interconnect 450$b$ is in a different depth layer of antenna substrate 130' than the ground conductors of CPW interconnect 450$b$. Nevertheless, even though central conductor 308$a$ and ground conductors 135$a$, 135$b$ are not exactly coplanar, because the difference in depths between layer 308 and ground plane layer 135 is so small, no significant performance degradation occurs, whereby CPW interconnect 450$b$ still operates effectively as a coplanar transmission line. Further, since opening 441 is formed in ground plane 135 directly beneath central conductor 308$a$, ground plane 135 does not disturb the fields of signals propagating across CPW interconnect 450$b$.

Conductive well 472$a$ couples central conductor 308$a$ to RF contact 182 through a contact pad 330 and a conductive joint 176. Deeper conductive wells 372$b$ and 372$c$ couple ground conductors 135$b$ and 135$c$, respectively, to ground contacts 197 and 199, respectively. Hence, conductive wells 472$a$, 372$b$ and 372$c$ form a GSG transition between a first end of CPW interconnect 450$b$ to RFIC chip 110. A similar or identical GSG transition may be provided by conductive wells 473$a$, 373$b$ and 373$c$ to couple the opposite end of CPW interconnect 450$b$ to contacts 184, 195 and 196 of second RFC 120.

Figure 6A:
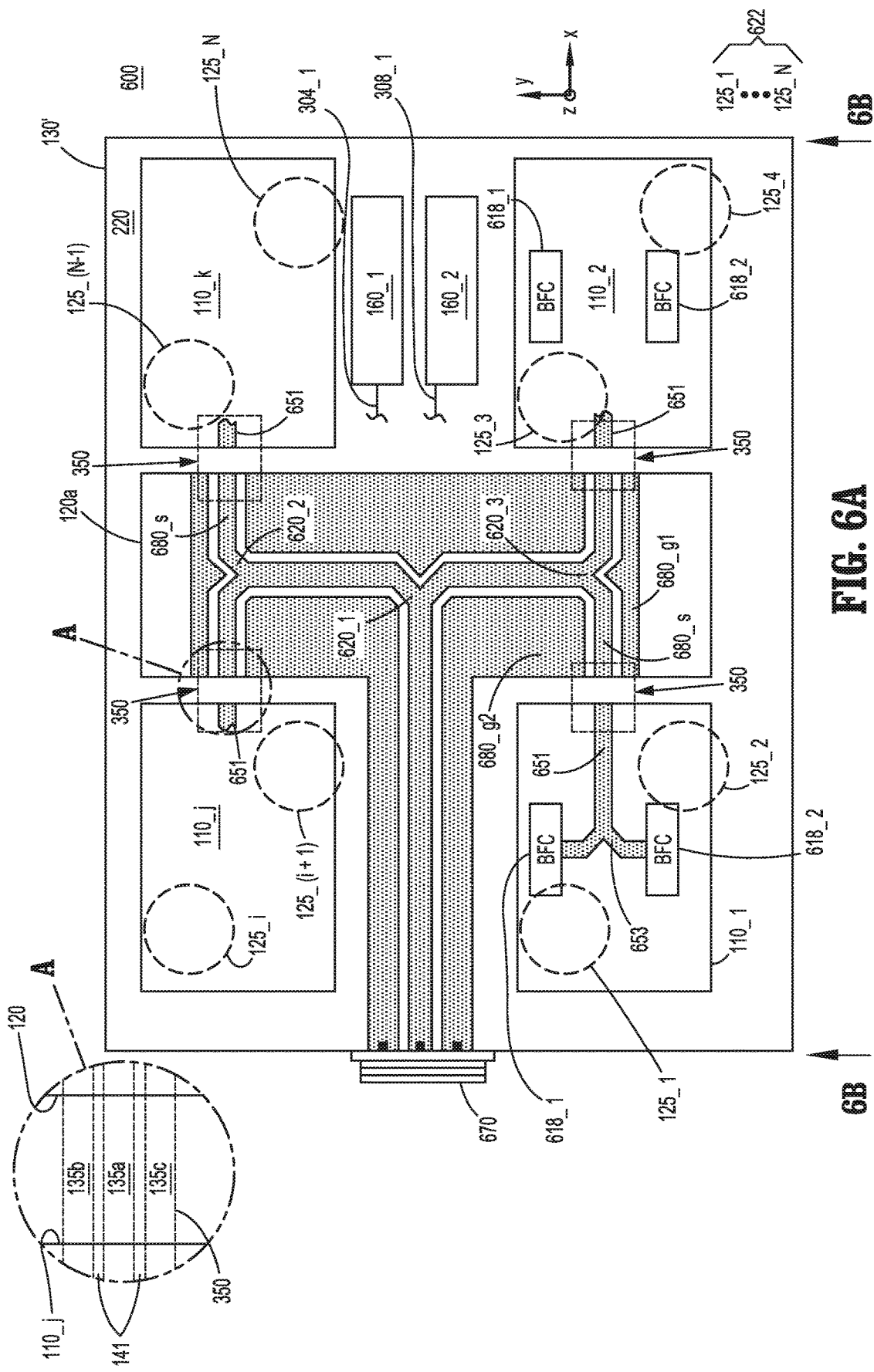
FIG. 6A is a top plan view of an active array antenna apparatus according to an embodiment.
Figure 6B:
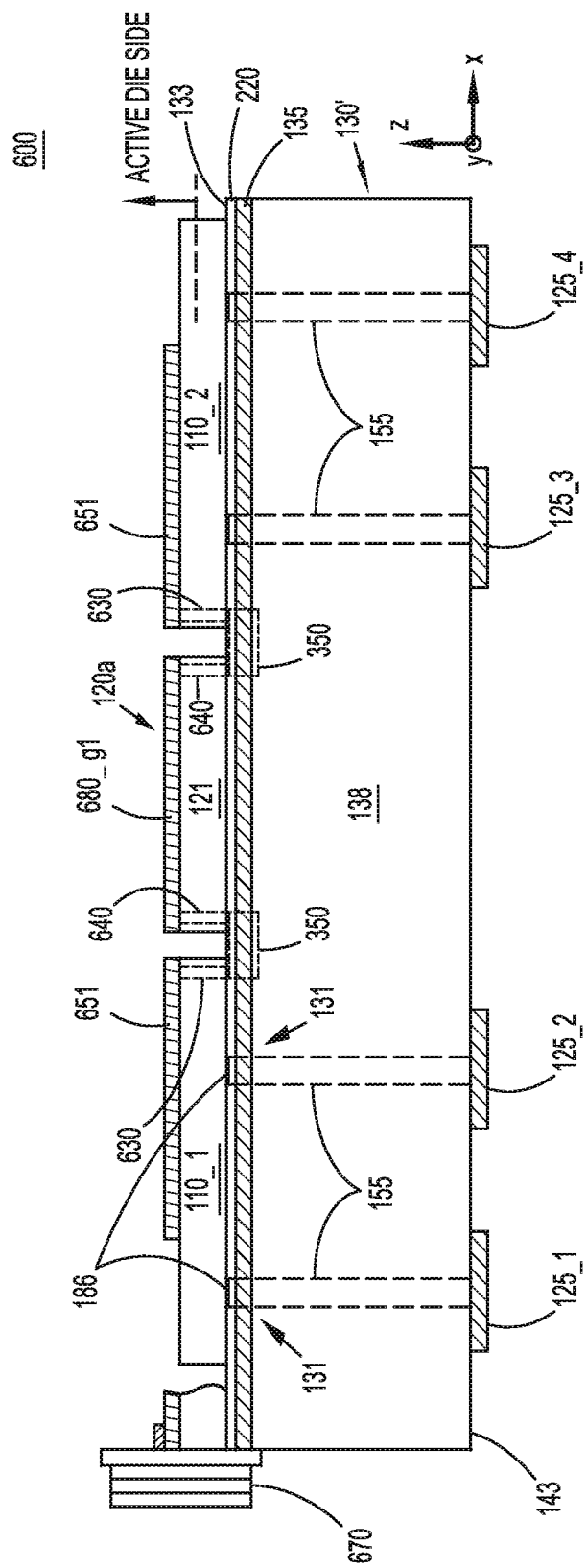
FIG. 6B is an end view of the active array antenna apparatus viewed from the direction 6B of FIG. 6A.

FIG. 6A is a top plan view of an active antenna array apparatus ("antenna array") 600 according to an embodiment. FIG. 6B is an end view of antenna array 600 viewed from the direction 6B of FIG. 6A. Antenna array 600, which includes RDL region 220, is an example of either antenna 100' or 100" described above. However, a similar layout and connection scheme may apply to an antenna array without an RDL region such as antenna 100 of FIGS. 1A-1E.

Antenna array 600 includes a plurality K of RFIC chips 110_1 to 110_K, and a combiner/divider component 120$a$, which is an example of second RFC 120. A plurality N of antenna elements 125_1 to 125_N forming a planar array 622 may be disposed at lower surface 143 of antenna substrate 130'. Each RFIC chip 110 may be coupled to a plurality M of antenna elements 125 (M=2 in the shown example) through M beam forming circuitry (BFC) units 618_1 to 618_M. The values of integers K, M and N may differ from embodiment to embodiment depending on the application. In FIG. 6A, a "small array" example in which K=4, N=8 and M=2 is shown and discussed for simplicity of understanding.

Combiner/divider component ("combiner/divider") 120$a$ is coupled to each of RFIC chips 110 through a respective CPW interconnect 350 (or 450). Detail "A", for example, illustrates that central conductor 135$a$ and ground conductors 135$b$, 135$c$ of CPW interconnect extend across a gap between an RFIC chip 110_$j$ and combiner/divider 120$a$. Combiner/divider 120$a$ is illustrated with coplanar waveguide at an upper surface thereof, which includes signal conductors 680_$s$ and first and second ground conductors 680_$g1$ and 680_$g2$ on opposite sides of each signal conductor 680_$s$. RFIC chips 110 are illustrated as microstrip type chips with microstrip signal conductors 651 at an upper surface facing away from antenna substrate 130' (arranged in a "non-flip-chip" arrangement) and with a microstrip ground plane (not shown) at the lower surface or at an interim level of the chip. For instance, FIG. 6B illustrates that at least one via 630 extending vertically through an RFIC 110 in the z direction may couple the first end of CPW interconnect 350 to signal conductor 651. The second end of CPW interconnect 350 may be coupled to the CPW transmission line of combiner/divider 120$a$ through a plurality of vias 640 extending through dielectric 121.

Alternatively, CPW type RFIC chips 110 and/or a microstrip combiner/divider 120$a$ are employed, and/or RFIC chips 110 are connected as flip chips with signal conductors 651 located at the lower surfaces of RF chips 110.

The CPW conductors of combiner/divider 120$a$ may be coupled at K locations to K signal conductors 651 of RFIC chips 110_1 to 110_K through K CPW interconnects 350, respectively. Each of the K locations of signal conductor 680_$s$ may be referred to as a combiner/divider conductor of the combiner/divider 120$a$. Each RFIC chip 110 is also shown to include two beam forming circuitry (BFC) units 618_1 and 618_2, where BFC units 618_1 and 618_2, along with 2:1 a combiner/divider 653 and signal line 651, may collectively form beam forming circuitry 118 of an RFIC chip 110 discussed earlier. Other embodiments employ a single BFC unit 618 or three or more BFC units 618.

Combiner/divider 120$a$ may include 2:1 RF couplers 620_1, 620_2 and 620_3 such as Wilkinson or hybrid couplers to form an overall K:1 combiner/divider. An example material of a dielectric substrate 121 of combiner/divider 120$a$ is alumina. In transmission line or large element arrays, combiner/divider 120$a$ may be composed of multiple sections of alumina to facilitate manufacturing, particularly in the handling of brittle alumina substrates. The RF circuitry of the multiple sections of alumina may be interconnected by CPW interconnects 350 or by an alternative connection scheme.

Each BFC unit 618 includes an amplifier and/or a phase shifter to adjust a transmit signal and/or a receive signal provided to/from an antenna element 125. With RFIC chips 110 distributed across the effective aperture of antenna array 600 and each coupled to one or more antenna elements 125, antenna 600 may be understood as an active antenna array. In embodiments where BFC units 618 each include a phase shifter(s) for dynamic phase shifting of the signals, antenna array 600 functions as a phased array. In such a phased array embodiment, a beam formed by antenna 600 is steered to a desired beam pointing angle set mainly according to the phase shifts of the phase shifters. Additional amplitude adjustment capability within RFICs 110 may also be included to adjust the antenna pattern. In any case, antenna 600 may be configured as a transmitting antenna system, a receiving antenna system, or both a transmitting and receiving antenna system.

Figure 8:
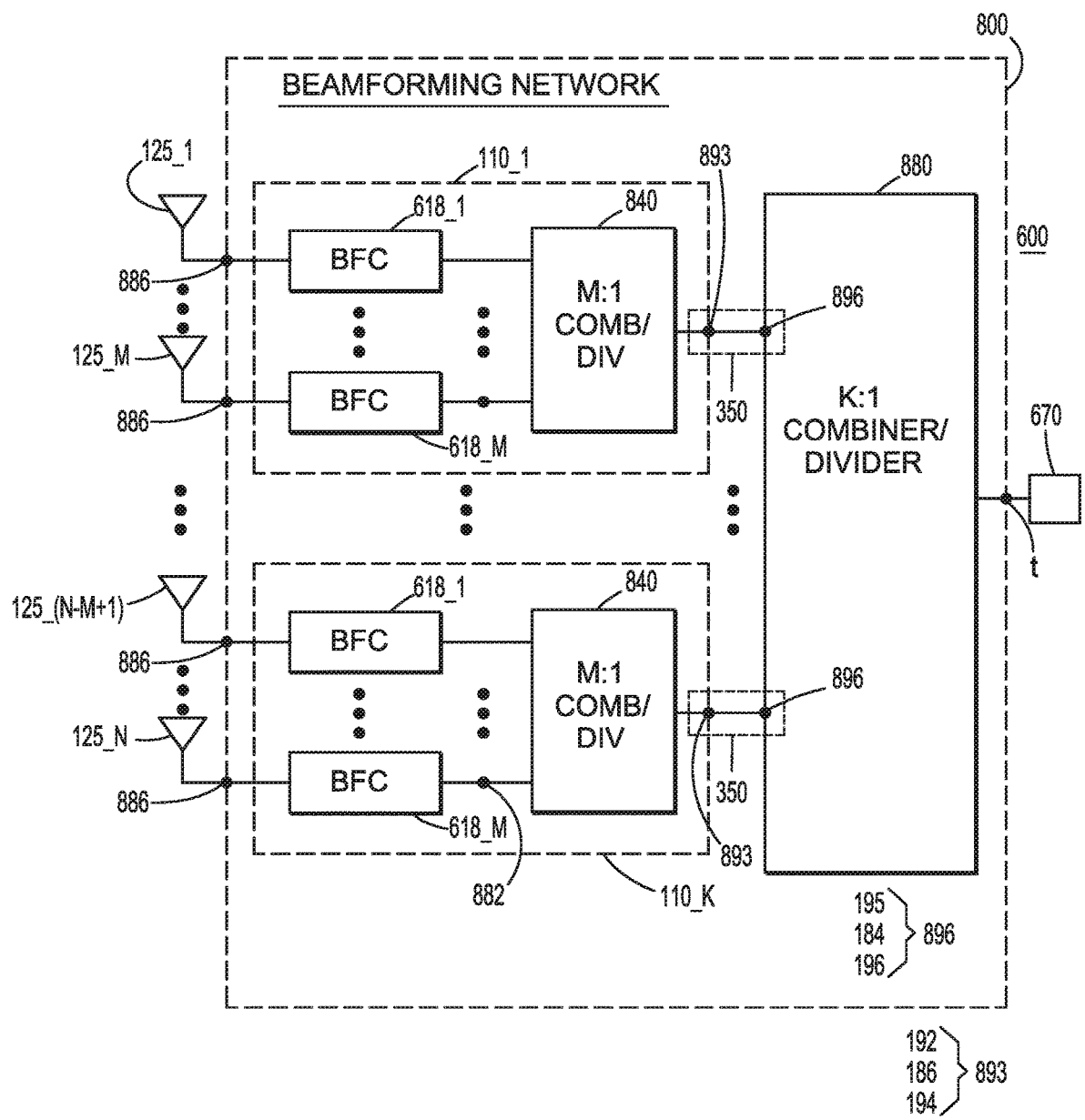
FIG. 8 is a schematic diagram depicting a beamforming network within any of the antenna apparatus.

A connector 670 may be side mounted or top mounted and connect to signal conductor 680_$s$. In the transmit direction, an input RF transmit signal is applied to connector 670 and divided into K divided transmit signals by couplers 620 and the K divided transmit signals are applied to RFIC chips 110_1 to 110_K, respectively. (A schematic illustration of signal flow is shown in FIG. 8, discussed later.) If an RFIC 110 includes a plurality M of BFC units 618, the RFIC 110 may further include an M:1 combiner/divider 653 that splits the divided transmit signal into M further divided signals, each applied to one of the BFC units 618. Once adjusted by the BFC units 618, the adjusted signals are "element signals" that may each be applied to one of antenna elements 125.

A reverse signal flow occurs in the receive direction, in which an element signal is received by a BFC unit 618 from an antenna element 125, and adjusted by a receive amplifier and/or a phase shifter (and typically filtered). The adjusted receive signal is routed through combiner/dividers 153 and 120a to produce a composite receive signal at connector 170. It is noted here that a beam forming network (BFN) may be considered to encompass all of the signal paths between signal connector 670 and antenna elements 125_1 to 125_N. In the BFN, a single input transmit signal is divided into N element signals, and/or N element signals received from antenna elements 125 are combined into a single composite receive signal.

In FIGS. 6A and 6B, two antenna elements 125_1 and 125_2 are shown coupled to each RFIC 110 as an example. In other examples, each RFIC chip 110 is coupled to a single antenna element 125, or to three or more antenna elements 125. Antenna 600 is also shown to include additional chips 160_1 and 160_2, such as serial peripheral interface (SPI) chips. Chips 160 may function to provide DC signals and/or control signals to the RFIC chips 110 through signal lines such as 304_1, 308_1 formed by patterning of conductive layers 304 and 308, respectively, of RDL region 220. The DC signals may bias amplifiers and/or control switching states of switches within BFC units 618_1, 618_2. The control signals may control phase shifts of phase shifters within the BFC units.

Figure 7A:
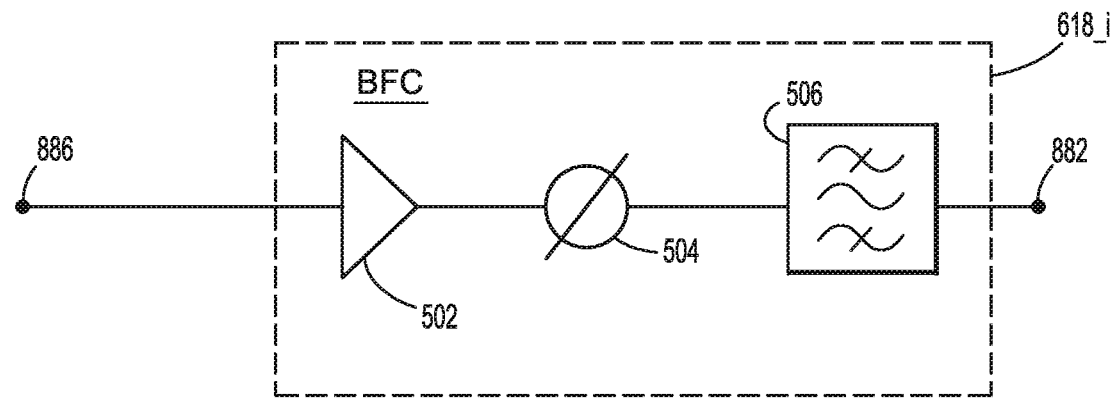
FIGS. 7A, 7B and 7C are schematic diagrams of beamforming circuitry within any of the example antenna apparatus.

FIG. 7A shows example beamforming circuitry of a BFC unit 618_i (i=any integer from 1 to M) configured for a receive path (antenna receiving direction) of an RFIC chip 110. BFC unit 618_i may include front end receiving circuitry coupled between an input side 886 (coupled to an antenna element 125) and an output side 882 (coupled to CPW interconnect 350 directly or through combiner/divider 653). The receiving circuitry may include a low noise amplifier (LNA) 502, a receive path phase shifter 504 and a bandpass filter 506 connected in series. LNA 502 and phase shifter 504 may receive bias/control voltages from vias/signal lines (not shown) within RFIC chip 110 extending from electrical contacts such as 357, 367 (seen in FIGS. 2A and 3).

Figure 7B:
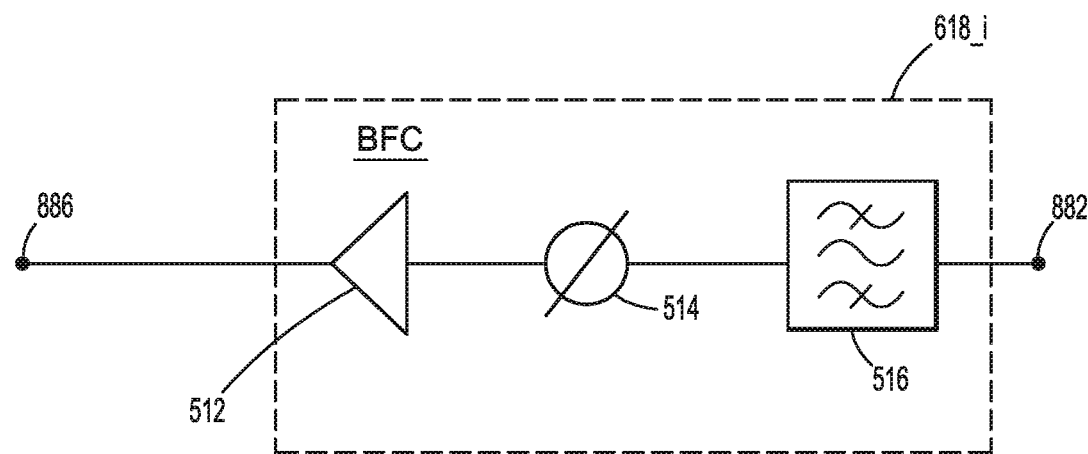

FIG. 7B depicts example beamforming circuitry of a BFC unit 618_i configured for a transmit path (antenna transmitting direction) of an RFIC chip 110. Here, front end circuitry within BFC unit 618_i may include a power amplifier (PA) 51, a transmit path phase shifter 514 and a bandpass filter 516 connected in series between input side 886 and output side 882. PA 512 and phase shifter 514 may also receive bias/control voltages from vias/signal lines (not shown) within RFIC chip 110 extending from electrical contacts such as 357, 367.

Figure 7C:
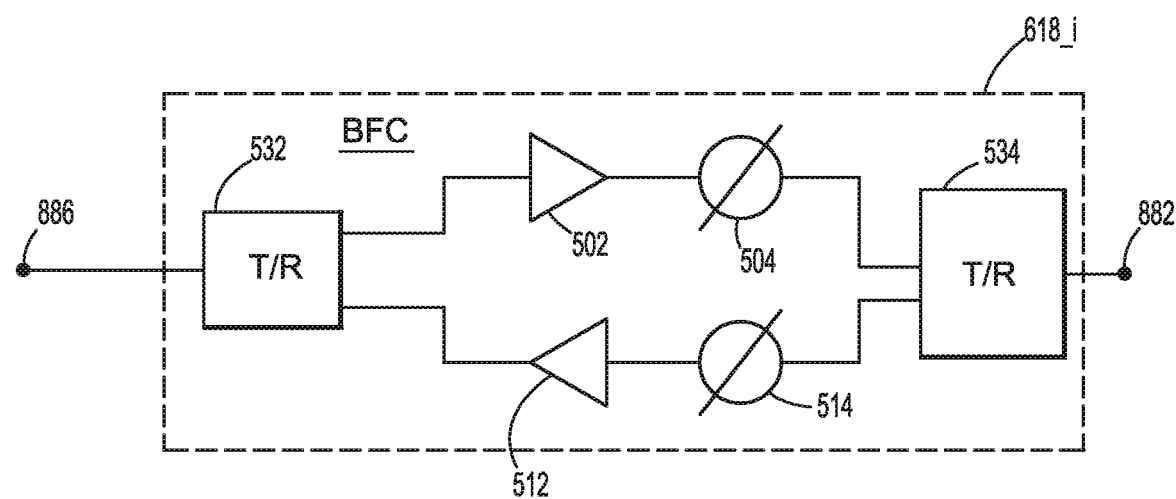

FIG. 7C shows example beamforming circuitry of a BFC unit 618_i configured for both a receive path and a transmit path of an RFIC chip 110. In this case, BFC unit 618_i includes first transmit/receive (T/R) circuitry 532 having an input port connected to input side 886, and second T/R circuitry 534 with an input port connected to output side 882. A receive path including LNA 502 and phase shifter 504 may be connected between first output ports of T/R circuitry 532, 534. A transmit path including phase shifter 514 and PA 512 may be connected between second output ports of T/R circuit circuitry 532, 534. T/R circuitry 532, 534 may each include bandpass filters and/or switches to allow both transmit and receive path signals to pass from the input port to a respective output port. In some examples, different frequency bands are used for transmit vs. receive signals and bandpass filtering is sufficient to provide isolation between the paths. Time division multiplexed based switching may provide further or alternative isolation between the paths.

FIG. 8 is a schematic diagram depicting an example beamforming network (BFN) 800 within antenna array 600. BFN 800 may include a K:1 combiner/divider 880 and K RFIC chips 110_1 to 110_K, each having M BFC units 618_1 to 618_M (e.g., with any of the circuitry arrangements of FIGS. 7A-7C) and an M:1 combiner/divider 840. K:1 combiner/divider 880 may be formed by combiner/divider component 120a and has an input port at a circuit point t. CPW interconnects 350 (alternatively, 150 or 450) couple each of K outputs 896 of K:1 combiner divider 880 to a respective input 893 of an M:1 combiner 840. Each RFIC chip 110 may be coupled to M antenna elements such as 125_1 to 125_M. Thus, there may be N antenna elements 125_1 to 125_N, where N=M×K. As noted earlier, the number N may number in the hundreds or thousands for a typical antenna 600 designed to form a narrow antenna beam.

Figure 9:
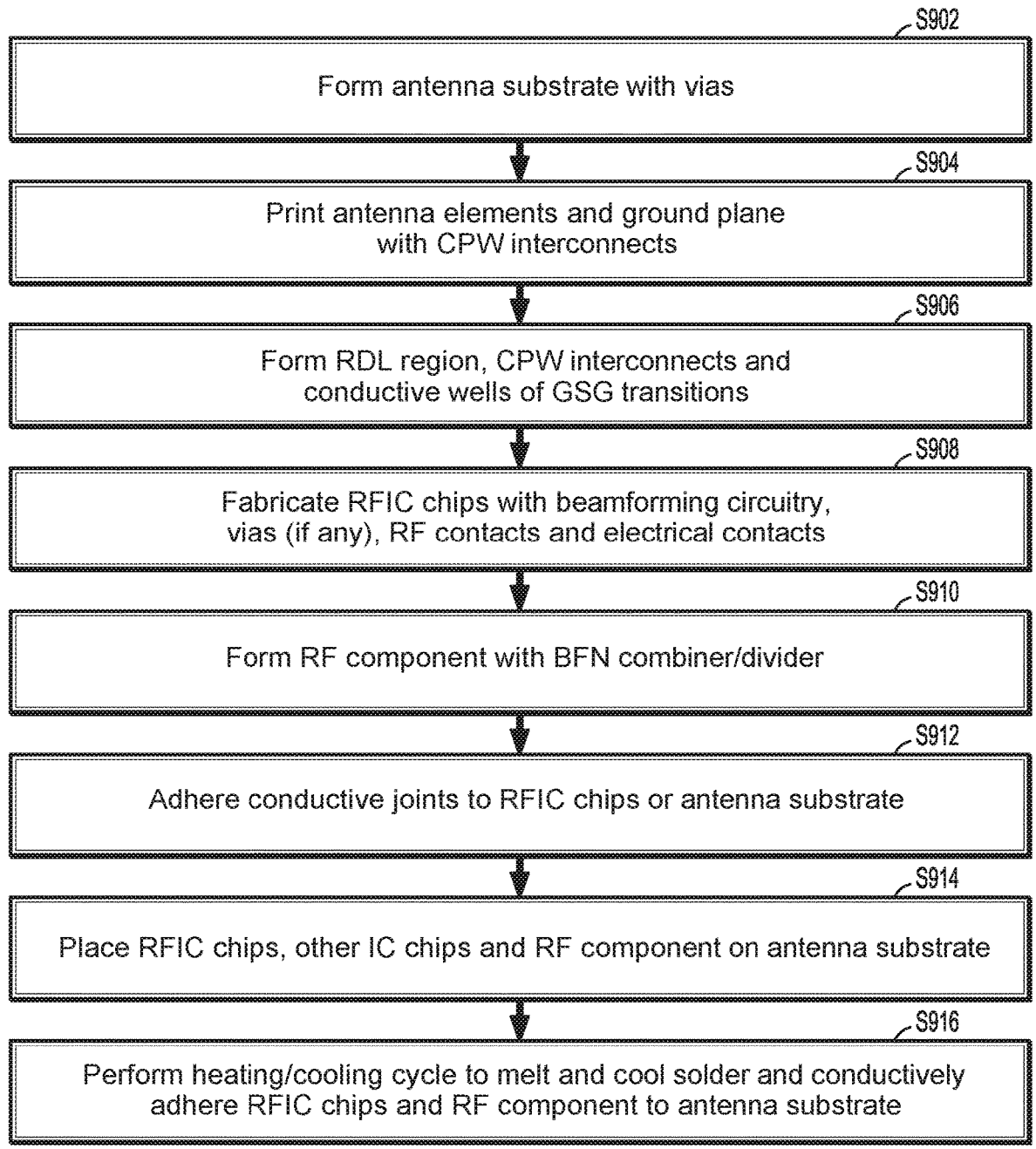
FIG. 9 is a flow diagram of an example method of fabricating an antenna apparatus according to an embodiment.

FIG. 9 is a flow chart of an example method, 900, of fabricating antenna 600. The order of the shown operations may be modified as desired. In method 900, an antenna substrate 130' may be formed from a wafer and vias 155 may be formed therein by drilling holes and filling them with conductive material in an electroplating or like process (S902). Antenna elements 125 and ground plane 135 may then be respectively printed on the lower and upper surfaces of the antenna substrate (S904). CPW interconnects 350 may be formed during this process step in the manner described earlier. An RDL region 220 may thereafter be formed on the antenna substrate 130' above the ground plane (S906). Conductive wells for GSG transitions, such as conductive wells 372, 373, 472, 473, and CPW interconnects 450 may be formed during this process step as described above.

RFIC chips 110 are separately fabricated with beamforming circuitry 118, vias (if necessary), RF contact pads and ground contact pads, and other electrical contacts such as 357, 367 (S908). Second RFC 120 may be separately formed with a BFN combiner/divider (S910). Conductive joints 176 may be initially adhered to RF contacts 186, 182 and other electrical contacts of RFIC chips 110 and/or to catch pads/other contacts at the upper surface of antenna substrate 130' (S912). The RFIC chips 110, other IC chips 160 and second RFC 120 may be placed on antenna substrate 130' (S914). A heating/cooling cycle may be performed to melt and cool solder or other conductive material of the conductive joints 176 and conductively adhere the RFIC chips, other IC chips, and second RFC 120 to the antenna substrate (S916).

In embodiments of an antenna apparatus described above, the provision of CPW interconnects formed in conjunction with a ground plane opening allows for the use of a single RF layer antenna substrate and its attendant advantages. Simulations have shown that the second openings in the ground plane (e.g. 141, 441) to accommodate the CPW transitions have minimal effect on antenna performance.

While the technology described herein has been particularly shown and described with reference to example embodiments thereof, it will be understood by those of ordinary skill in the art that various changes in form and details may be made therein without departing from the spirit and scope of the claimed subject matter as defined by the following claims and their equivalents.

What is claimed is:

1. An antenna apparatus comprising:
  an antenna substrate having a first surface and an opposite second surface, the antenna substrate including an antenna ground plane at the second surface;

an antenna element at the first surface of the antenna substrate;
a first radio frequency (RF) component attached to the second surface of the antenna substrate and including RF circuitry to adjust a signal communicated with the antenna element;
a second RF component attached to the second surface of the antenna substrate; and
a coplanar waveguide (CPW) interconnect coupling the first RF component to the second RF component and comprising a central conductor and first and second ground conductors on opposite sides of the central conductor, the central conductor having a profile within an opening in the antenna ground plane.

2. The antenna apparatus of claim 1, wherein the central conductor and the antenna ground plane are in a same layer of the antenna substrate.

3. The antenna apparatus of claim 2, wherein the first ground conductor is a first region of the antenna ground plane on a first side of the opening and the second ground conductor is formed by a second region of the antenna ground plane on a second side of the opening opposite the first side.

4. The antenna apparatus of claim 1, wherein:
the opening in the ground plane is a second opening in the ground plane; and
the signal is communicated between the RF circuitry and the antenna element through a first opening in the antenna ground plane.

5. The antenna apparatus of claim 1, wherein the antenna substrate further comprises a redistribution layer (RDL) region between the antenna ground plane and the second surface.

6. The antenna apparatus of claim 5, wherein the central conductor is in a conductive layer of the RDL region.

7. The antenna apparatus of claim 6, wherein:
the first ground conductor is a first region of the antenna ground plane on a first side of the second opening; and
the second ground conductor is a second region of the antenna ground plane on a second side of the second opening opposite the first side.

8. The antenna apparatus of claim 6, wherein:
the central conductor is in a first conductive region of a first conductive layer of the RDL region; and
the first and second ground conductors are respectively in second and third conductive regions of a second conductive layer of the RDL region.

9. The antenna apparatus of claim 8, wherein the first and second ground conductors are within the same conductive layer of the RDL region as the central conductor.

10. The antenna apparatus of claim 1, wherein the second RF component comprises a portion of a beamforming network that divides an input transmit signal into a plurality of divided transmit signals each provided to one of a plurality of RFIC chips attached to the antenna substrate, and/or receives a plurality of receive signals from the plurality of RFIC chips, respectively, and combines the receive signals to form an output signal, each of the plurality of RFIC chips being connected to the second RF component by a respective said CPW interconnect.

11. The antenna apparatus of claim 1, wherein the opening in the ground plane is a second opening, and the antenna substrate includes a via formed therein and extending through a first opening in the antenna ground plane, the via coupling a first RF contact of the first RF component to the antenna element, the first RF contact being coupled to an input point of the RF circuitry.

12. The antenna apparatus of claim 11, wherein:
a lower surface of the first RF component is attached to the second surface of the antenna substrate through a plurality of electrical connection joints;
a first one of the electrical connection joints couples the first RF contact to the via;
a second one of the electrical connection joints couples a second RF contact of the first RF component to the central conductor of the CPW interconnect, the second RF contact being coupled to an output point of the RF circuitry; and
a third one of the electrical connection joints couples a ground contact of the first RF component to the antenna ground plane.

13. The antenna apparatus of claim 12, wherein the third electrical connection joint couples the ground contact to a region on one side of the second opening, and a fourth one of the electrical connection joints couples another ground contact of the first RF component to the antenna ground plane on an opposite side of the second opening.

14. The antenna apparatus of claim 1, wherein the second RF component comprises:
a dielectric substrate having a lower surface attached to the second surface of the antenna substrate; and
a CPW transmission line formed at an upper surface of the dielectric substrate and coupled to the CPW interconnect through a plurality of vias formed through the dielectric substrate.

15. The antenna apparatus of claim 1, wherein the RF circuitry of the first RF component is formed in a microstrip transmission line.

16. The antenna apparatus of claim 1, wherein the RF circuitry of the first RF component is formed in a CPW transmission line.

17. The antenna apparatus of claim 1, wherein the RF circuitry comprises beamforming circuitry including at least one of a transmit amplifier, a receive amplifier and a phase shifter for adjusting the signal communicated between the first RF component and the antenna element.

18. A phased array antenna comprising:
an antenna substrate having a first surface and an opposite second surface, the antenna substrate including an antenna ground plane at the second surface;
a plurality of antenna elements forming an antenna array at the first surface of the antenna substrate;
a plurality of radio frequency integrated circuit (RFIC) chips attached to the second surface of the antenna substrate, each including beamforming circuitry for beam steering by adjustment of signals communicated with at least one of the antenna elements through at least one of a plurality of first openings in the antenna ground plane, the beamforming circuitry being a first portion of a beamforming network (BFN);
a combiner/divider component coupled between the RFIC chips and attached to the second surface of the antenna substrate, the combiner/divider component being a second portion of the BFN and including a plurality of combiner/divider conductors; and
a plurality of coplanar waveguide (CPW) interconnects each coupling a respective one of the combiner/divider conductors to one of the RFIC chips and comprising a central conductor and first and second ground conductors on opposite sides of the central conductor, the central conductor having a profile within a respective one of a plurality of second openings in the antenna ground plane.

19. The phased array antenna of claim 18, wherein the central conductor of each of the CPW interconnects, and the antenna ground plane, are in a same layer of the antenna substrate.

20. The phased array antenna of claim 19, wherein, for each of the CPW interconnects, the first ground conductor is a first region of the antenna ground plane on a first side of the respective second opening, and the second ground conductor is a second region of the antenna ground plane on a second side of the respective second opening opposite the first side.

21. The phased array antenna of claim 18, wherein:
the antenna substrate further comprises a redistribution layer (RDL) region comprising a plurality of conductive lines between the antenna ground plane and the second surface.

22. The phased array antenna of claim 21, wherein, for each of the CPW interconnects, the central conductor is in a conductive layer of the RDL region.

23. The phased array antenna of claim 22, wherein, for each of the CPW interconnects:
the first ground conductor is a first region of the antenna ground plane on a first side of the second opening; and
the second ground conductor is a second region of the antenna ground plane on a second side of the second opening opposite the first side.

24. The phased array antenna of claim 22, wherein, for each of the CPW interconnects:
the central conductor is in a first conductive region of a first conductive layer of the RDL region; and
the first and second ground conductors are respectively in second and third conductive regions of a second conductive layer of the RDL region.

25. The phased array antenna of claim 24, wherein the first and second ground conductors are formed within the same conductive layer of the RDL region as the central conductor.

26. The phased array antenna of claim 18, wherein the antenna substrate includes a plurality of vias formed therein and each extending through a respective one of the first openings in the antenna ground plane, each of the vias coupling a respective first RF contact of one of the RFIC chips to one of the antenna elements, the respective first RF contact being coupled to an input point of the beamforming circuitry of the respective one of the RFIC chips.

27. The phased array antenna of claim 26, wherein:
a lower surface of each of the RFIC chips is attached to the second surface of the antenna substrate through a plurality of electrical connection joints;
for each RFIC chip of the RFIC chips:
a first one of the electrical connection joints couples the first RF contact to the via;
a second one of the electrical connection joints couples a second RF contact of the RFIC chip to the central conductor of one of the CPW interconnects, the second RF contact being coupled to an output point of the beamforming circuitry of the RFIC chip; and
a third one of the electrical connection joints couples a ground contact of the RFIC chip to the antenna ground plane.

28. The phased array antenna of claim 27, wherein the third one of the electrical connection joints couples the ground contact to a region on one side of the second opening, and a fourth one of the electrical connection joints couples another ground contact of the RFIC chip to the antenna ground plane on an opposite side of the second opening.

29. The phased array antenna of claim 18, wherein the combiner/divider component comprises:
a dielectric substrate having a lower surface attached to the second surface of the antenna substrate; and
a CPW transmission line formed at an upper surface of the dielectric substrate and coupled to each of the CPW interconnects through a plurality of vias formed through the dielectric substrate.

30. The phased array antenna of claim 18, wherein the RFIC chips are each formed in a microstrip transmission line.

31. The phased array antenna of claim 18, wherein the RFIC chips are each formed in a CPW transmission line.

* * * * *